United States Patent [19]
Stack et al.

[11] Patent Number: 6,121,369
[45] Date of Patent: Sep. 19, 2000

[54] LIQUID CRYSTALLINE POLYESTER COMPOSITIONS CONTAINING CARBON BLACK

[75] Inventors: Gary Michael Stack; Theodore Roosevelt Walker, Jr., both of Kingsport, Tenn.

[73] Assignee: Eastman Chemical Company, Kingsport, Tenn.

[21] Appl. No.: 09/052,639

[22] Filed: Mar. 31, 1998

Related U.S. Application Data

[60] Provisional application No. 60/048,830, Jun. 6, 1997.

[51] Int. Cl.[7] ........................................ C08K 3/00
[52] U.S. Cl. ............................ 524/495; 524/498
[58] Field of Search .................... 524/495, 496

[56] References Cited

U.S. PATENT DOCUMENTS

| | | | |
|---|---|---|---|
| 4,169,933 | 10/1979 | Jackson, Jr., et al. | 528/190 |
| 5,110,896 | 5/1992 | Waggoner et al. | 528/190 |
| 5,124,397 | 6/1992 | Kanazawa et al. . | |

FOREIGN PATENT DOCUMENTS

| | | |
|---|---|---|
| 07-196894 | 12/1993 | Japan . |
| 8-13248 | 1/1996 | Japan . |
| 8-220407 | 8/1996 | Japan . |
| WO 96/06888 | 7/1995 | WIPO . |
| 9606888 | 3/1996 | WIPO . |

OTHER PUBLICATIONS

Derwent Publications Ltd., London, GB; Class A23, AN 95–299707, XP002077694, & JP 07 196894 (Toray Ind Inc.) Aug. 1, 1995 (abstract).

Derwent Publications Ltd., London, GB; XP002077695, & JP 05 344049 A (Unitika Ltd) Nov. 22, 1993 (abstract).

JP 8–220407, Derwent Abstract, Aug. 30, 1996.

JP 08–013248, Derwent Abstract, Jan. 16, 1996 and translated claims.

*Primary Examiner*—Edward J. Cain
*Attorney, Agent, or Firm*—B. J. Boshears; H. J. Gwinnell

[57] ABSTRACT

Disclosed are liquid crystalline polyester molding compositions which are capable of being molded into an article having a thickness of less than 1.5 mm and a flammability classification of 94V-O as determined by the UL-94 20 mm Vertical Burning Test (ASTM D 3801) which are comprised of (i) certain all-aromatic, liquid crystal polyester consisting essentially of terephthalic acid residues, 2,6-naphthalenedicarboxylic acid residues, hydroquinone residues, and p-hydroxybenzoic acid residues; and (ii) about 0.1 to 10 weight percent, based on the total weight of the liquid crystalline polyester molding composition, carbon black. These liquid crystalline polyester molding compositions also may contain glass fiber. The disclosed molding compositions are particularly useful for manufacturing circuit boards and electrical connectors for use in various electronic devices.

18 Claims, No Drawings

LIQUID CRYSTALLINE POLYESTER COMPOSITIONS CONTAINING CARBON BLACK

REFERENCE TO RELATED APPLICATION

This application claims the benefit of U.S. Provisional Application No. 60/048,830, filed Jun. 06, 1997.

FIELD OF THE INVENTION

This invention pertains to novel liquid crystalline polyester compositions derived from terephthalic acid, 2,6-naphthalenedicarboxylic acid, hydroquinone, and p-hydroxybenzoic acid containing about 0.1 to 10 weight percent carbon black. These new compositions may be molded into thin articles which exhibit a flammability classification of 94V-O as determined by the UL-94 Flammability Test. The liquid crystalline polyester compositions also possess excellent mechanical, temperature resistance, and flame resistance properties. The compositions are especially useful when compounded with glass fibers and injection molded into thin articles useful as supports for circuit boards and/or electrical connectors for electrical/electronic applications, such as in computers.

BACKGROUND OF THE INVENTION

Liquid crystalline polyesters (LCP's) are unique among polymers because they have very high tensile, flexural, and temperature resistance properties which are very desirable for high performance applications, such as in structural applications and in electrical and electronic applications. Another property that is highly desirable for the electrical and electronic applications is a high resistance to burning. This property is most often measured by the Underwriters Laboratories Flammability Test (UL-94). A rating of V-O (which is the best rating possible from the test) is desired for the electrical and electronic applications.

Among the earliest LCP's available were those derived from poly(ethylene terephthalate) and p-acetoxybenzoic acid. These LCP's had the disadvantages of relatively poor temperature resistance and inadequate flammability characteristics. Subsequently, all-aromatic LCP's then were developed and commercialized. Typical of these all-aromatic LCP's are those described in U.S. Pat. No. 4,169,933 and derived from terephthalic acid, 2,6-naphthalenedicarboxylic acid, hydroquinone, and p-hydroxybenzoic acid. Relatively thin, e.g., less than 1.5 mm, articles having good tensile and flexural modulus properties, and high thermal (heat distortion temperature) properties are employed as circuit boards in the electrical/electronic industry. For such electronic applications, it is important that these thin articles exhibit excellent resistance to burning, e.g., a classification of 94V-Oas determined by the UL-94 20 mm Vertical Burning Test (ASTM D 3801).

U.S. Pat. No. 5,124,397 discloses a resin composition for sliding movement comprising (a) certain thermotropic, liquid crystalline polyesters and (b) 10 to 70 weight percent spherical glassy carbon. Most of the disclosed compositions also contain graphite, glass fiber or poly(tetrafluoroethylene). The flammability characteristics of the resin compositions are not mentioned in the patent. Japanese Published Patent Application JP 08-220,407 A discloses a light pickup lens holder comprising a filled, flame-retardant liquid crystal resin. PCT International Application WO 96/06888 discloses LCP's which contain a small amount of low molecular weight polyethylene. The polyethylene acts as an internal lubricant or mold release but does not significantly increase the flammability of the LCP composition. Example 4C of this PCT patent document discloses an LCP composition consisting of (i) 61.5% of an LCP containing residues of hydroquinone (9.6%), 4,4'biphenol (9.6%), terephthalic acid (13.5%), 2,6-naphthalenedicarboxylic acid (5.8%), and p-hydroxybenzoic acid (61.5%), (ii) 0.5% oxidized low pressure polyethylene, (iii) 23.3% fiberglass, (iv) 1.3% carbon black and (v) 13.3% talc. The LCP compositions contemplated by this PCT patent document are intended for use in the manufacture of main parts in driving devices of copying machines, printers and video-related equipment which require strong mechanical and high tribology characteristics. Flammability characteristics of the LCP compositions are not mentioned.

Japanese Published Patent Application JP 08-13,248 A discloses fire-resistant black polyester fibers prepared by mixing and melt spinning a master batch containing 5–40 weight percent carbon black and 60–95 weight percent poly(ethylene terephthalate)-based copolymer polyester prepared by copolymerization of poly(ethylene terephthalate) with 5–20 mole percent of an isophthalic acid component, and a matrix polymer consisting of poly(ethylene terephthalate) containing no carbon black. Liquid crystalline polyesters are not contemplated by this reference. Japanese Published Patent Application JP 07-196,894 A discloses a liquid crystalline resin composition consisting of 0.01–10 weight percent carbon black and a liquid crystalline polyesteramide or polyester forming an anisotropic melt phase. The liquid crystalline resin compositions also may contain 0.5–60 weight parts of a flame retardant organobromine compound per 100 parts of the liquid crystalline resin. JP 07-196,894 A discloses flammability characteristics only for resin compositions which contain a flame retardant amount of an organo-bromine compound which suggests that the presence of such a flame retardant is essential to an acceptable flammability rating.

SUMMARY OF THE INVENTION

We have discovered a select class of liquid crystalline polyester compositions comprising (i) certain all-aromatic liquid crystal polyesters, (ii) carbon black and, optionally, (iii) glass fibers exhibit excellent tensile and flexural modulus properties, high thermal (heat distortion temperature) properties and improved flammability characteristics. Compositions comprising components (i) and (ii) and glass fibers, e.g., 30 weight percent glass fibers, exhibit a flammability classification of 94V -O and reduced afterflame times as determined by the UL-94 20 mm Vertical Burning Test (ASTM D 3801) using an article having a thickness of less than 1.5 mm, preferably less than 1 mm, molded from the liquid crystal polyester composition. The liquid crystal polyester component of the compositions of the present invention consists essentially of diacid residues consisting essentially of terephthalic acid (T) and 2,6-naphthalenedicarboxylic acid (N) residues; diol residues consisting of hydroquinone (HQ) residues; and phydroxybenzoic acid (PHB) residues. More specifically, the all-aromatic, liquid crystalline polyesters utilized in the present invention consist essentially of about 1.5 to 25 mole percent terephthalic acid (T) residues, about 6.5 to 37 mole percent 2,6-naphthalenedicarboxylic acid (N) residues, about 16 to 42 mole percent hydroquinone (HQ) residues, and about 17 to 67 mole percent phydroxybenzoic acid (PHB) residues; wherein the total mole percent of T, N, HQ and PHB residues is equal to 100. Preferably, the T:N molar ratio is about 10:90 to about 60:40, the moles of HQ are equal to the total moles of T and N, and the liquid crystalline polyesters have melting points determined by differential scanning calorimetry (DSC) equal to or less than 365° C.

We have discovered that the addition of carbon black to all-aromatic liquid crystalline polyesters improves the flammability characteristics of such polyesters by significantly reducing the afterflame times obtained in the UL-94 20 mm Vertical Burning Test (ASTM D 3801). Our investigations have shown that the addition of carbon black along with glass fiber to allaromatic liquid crystalline polyesters reduces the afterflame time during the UL-94 test and may improve the flammability rating of the polyester to V-O as measured by the UL-94 20 mm Vertical Burning Test. The excellent flammability rating which the liquid crystalline polyester compositions of the invention exhibit is not dependent upon the presence therein of any flame retardants such as bromine-containing flame retardants. Such bromine-containing compounds present both health and corrosion problems and their use in molding compositions normally is not favored. Thus, the polyester compositions of the present invention preferably are essentially devoid of any flame retardants, particularly bromine-containing flame retardants.

Therefore, our invention, in its broadest aspects, provides a novel liquid crystalline polyester molding composition comprising:

(i) a liquid crystal polyester consisting essentially of about 1.5 to 25 mole percent terephthalic acid (T) residues, about 6.5 to 37 mole percent 2,6-naphthalenedicarboxylic acid (N) residues, about 16 to 42 mole percent hydroquinone (HQ) residues, and about 17 to 67 mole percent p-hydroxybenzoic acid (PHB) residues; wherein the total mole percent of T, N, HQ and PHB residues is equal to 100; and (ii) about 0.1 to 10 weight percent, based on the total weight of the liquid crystalline polyester molding composition, carbon black;

provided that articles having a thickness of less than 1.5 mm molded from the molding composition which also contains at least 20 weight percent glass fiber exhibit a flammability classification of 94V -O as determined by the UL-94 20 mm Vertical Burning Test (ASTM D 3801). A second embodiment of our invention is the liquid crystalline polyester molding composition defined above which also contains at least 20 weight percent glass fibers. The liquid crystalline polyester molding compositions of the present invention are particularly well suited for use in the manufacture of circuit boards in various electronic devices.

DESCRIPTION OF THE INVENTION

The all-aromatic, liquid crystalline polyesters provided by the present invention consist essentially of diacid residues consisting essentially of terephthalic acid (T) and 2,6-naphthalenedicarboxylic acid (N) residues; diol residues consisting of hydroquinone (HQ) residues; and p-hydroxybenzoic acid (PHB) residues, more specifically, 1.5 to 25 mole percent terephthalic acid (T) residues, about 6.5 to 37 mole percent 2,6-naphthalenedicarboxylic acid (N) residues, about 16 to 42 mole percent hydroquinone (HQ) residues, and about 17 to 67 mole percent p-hydroxybenzoic acid (PHB) residues; wherein the total mole percent of T, N, HQ and PHB residues is equal to 100. Preferably, the T:N molar ratio is about 10:90 to about 60:40, the moles of HQ are equal to the total moles of T and N, and the liquid crystalline polyesters have melting points determined by differential scanning calorimetry (DSC) equal to or less than about 375° C., most preferably less than about 365° C.

These liquid crystalline polyesters may be prepared by procedures well-known to those skilled in the art, e.g., by heating terephthalic acid, 2,6-naphthalenedicarboxylic acid, and acylated derivatives of hydroquinone and p-hydroxybenzoic acid with or without a catalyst to form the LCP and a volatile carboxylic acid. Examples of possible acylated derivatives of hydroquinone and p-hydroxybenzoic acid include hydroquinone diacetate and dipropionate and p-acetoxy- and p-propionyloxy-benzoic acid. Alternatively, the compositions may be prepared by heating terephthalic acid, 2,6-naphthalenedicarboxylic acid, hydroquinone, and p-hydroxybenzoic acid in a reactor with an aliphatic acid anhydride, such as acetic or propionic anhydride, with or without a catalyst, to first carry out the acylation of the hydroxy groups and then effect the polycondensation reaction as before described. For those skilled in the art, a useful variation of this alternative method is the separate acylation of the hydroxy-containing monomers in a first reactor, transferring this product to a second reactor, adding the dicarboxylic acids, and carrying out the polycondensation reaction as before described. Also, the liquid crystalline polyesters of the invention may be prepared by first synthesizing a relatively low molecular weight polyester by one of the previously described methods to form a prepolymer which then can be polymerized further to a high molecular weight by solid-state polymerization techniques well known to those skilled in the art. Also, a prepolymer of the polyesters of the invention may be prepared with or without a catalyst in an extruder and further polymerized to high molecular weight by solid-state polymerization techniques well known to those skilled in the art.

The diacid residues may be derived from terephthalic acid and 2,6-naphthalenedicarboxylic acid, diaryl esters thereof, e.g., diphenyl terephthalate and diphenyl 2,6-napthalenedicarboxylate, and, possibly, acid chlorides thereof, although the diacids are preferred. If the diaryl esters of the diacids are used, the phenolic hydroxyl groups of the hydroquinone and p-hydroxybenzoic acid should be unesterified.

Catalysts suitable for use in the preparation of the LCP's include dialkyl tin oxide, diaryl tin oxide, titanium dioxide, alkoxy titanium silicates, titanium alkoxides, alkali metal and alkaline earth metal salts of carboxylic acids, gaseous acid catalysts such as Lewis acids, e.g., $BF^3$, hydrogen halides, e.g., HCl, and the like. The quantity of catalyst utilized typically is about 50 to about 500 parts per million based on the total weight of starting materials (less the amount of any acyl anhydride employed. If a multi-step synthesis process is used as described above, the catalyst may be added during the acylation or polycondensation steps. The use of about 100 to about 300 parts per million by weight of at least one alkali metal-containing catalyst is sufficient.

The liquid crystalline polyesters of the present invention have inherent viscosities (I.V.'s) in the range of about 4 to 10 dL/g, preferably about 5 to 8 dL/g, measured at 25° C. in 60:40 by weight pentafluorophenol/1,2,4-trichlorobenzene at 0.1 g/100 mL in a Schott Gerate viscometer. As will be apparent to those skilled in the art, the liquid crystalline polyesters may contain minor amounts, e.g., up to 10 mole percent of the polyester, of residues derived from other diacid and diol monomers such as isophthalic acid, 1,4-cyclohexanedicarboxylic acid and 4,4'-biphenol provided, however, that the fundamental properties of the molding compositions of the invention are retained. The all-aromatic liquid crystalline polyesters most preferably consist solely of residues of terephthalic acid, 2,6-naphthalenedicarboxylic acid, hydroquinone, and p-hydroxybenzoic acid.

The liquid crystalline polyester molding compositions of the present invention contain about 0.1 to 10, preferably about 0.5 to 5, weight percent carbon black, based on the total weight of the molding composition. Any carbon black that is finely divided is suitable for use in the molding compositions of the present invention. Suitable carbon blacks include, but are not limited to, Black Pearl 800 and Dusty Dye Black 35 from Cabot Corporation. The particle size of the carbon blacks may range from about 10 to 500 nanometers with a particle size range of about 100 to 200 nanometers being preferred. The liquid crystalline polyester molding compositions most preferably contain about 1 to 3 weight percent carbon black. The carbon black may be added to the LCP by any means known to those skilled in the art, so long as the carbon black is well dispersed and does not deleteriously affect the mechanical properties of the composition. Examples of suitable dispersion methods include extrusion and addition of the carbon black during the preparation of the LCP. In the extrusion method, the LCP, carbon black, and other optional additives such as glass fiber may be extruded as a physical mixture. Also, the LCP and one of the other ingredients may be pre-extruded and pelletized, physically mixed with the remaining ingredient (s), and extruded. Alternatively, the LCP and carbon black or the LCP and glass fiber may be added at the extruder hopper and the other ingredient (the carbon black or glass fiber) may be side-fed later into the extruder. Preferably, the LCP, the carbon black, and the optional glass fiber are mixed in one operation so that production costs are held to a minimum. Another alternative is to pre-extrude a mixture of the carbon black, e.g., about 10 to 50 weight percent, in a suitable polymer, preferably the same liquid crystalline polyester, to form a masterbatch which then is further blended with additional LCP and glass fiber to prepare the desired blend.

Molding compositions comprising an intimate blend of the above-described all-aromatic, liquid crystalline polyester, carbon black and glass fibers constitute a second embodiment of the present invention. Normally, the polyester compositions will contain at least 20 weight percent, preferably about 25 to 40 weight percent, glass fibers. The glass fibers useful in preparing the compositions of the invention include those having thicknesses (diameters) of about 9 to 15 microns and fiber lengths of about 0.8 to 26 mm (about 1/32 to 1 inch). The glass fibers may be coated or uncoated.

The LCP/carbon black/glass fiber compositions of the present invention are especially useful for molding relatively thin articles, e.g., a thickness of less than 1.5 mm, preferably less than 1 mm. The LCP/carbon black/glass fiber compositions and molded articles may be prepared using the above-described compounding techniques and procedures which are conventional in the compounding and shaping of synthetic polymer compositions. For example, one or more of the liquid crystalline polyesters defined herein may be compounded with carbon black and glass fiber in an extruder and converted to pellets. The liquid crystalline polyester, carbon black and glass fiber may be compounded in 10 to 400-mm, twin-screw extruders which may be co-rotating or counter-rotating. Pellets of the LCP/carbon black/glass fiber compositions may be formed into molded articles by means of an injection molding machine. Suitable injection molding machines typically have 20 to about 500 toms clamping force.

The liquid crystalline molding compositions of the invention may contain various additives and fillers such as antioxidants, titanium dioxide, flame retardants, and drip suppressants, if desired. Articles molded from the compositions are useful for a variety of end uses requiring a combination of very good tensile, flexural, flammability, and thermal resistance properties. The molded articles are especially useful for use in electronic applications such as injection-molded circuit boards and electrical connectors that will withstand soldering conditions. An essential requirement of such circuit boards is that a test bar having a thickness of 0.8 mm (0.03125 inch) exhibit a flammability classification or rating of 94V-O as determined by the UL-94 20 mm Vertical Burning Test (ASTM D 3801).

The preparation of the liquid crystalline polyesters and the glass fiber-containing compositions of the present invention is further illustrated by the following examples. In the examples, inherent viscosities (I.V.'s; dL/g) of the LCP's are measured at 25° C. in 60:40 pentafluorophenol/1,2,4-trichlorobenzene at 0.1 g/100 mL in a Schott Gerate viscometer. The samples are dissolved by stirring at room temperature. Melting points are determined using a Differential Scanning Calorimeter, Model 2920, using a Thermal Analyst 2200 control system with LNCA II accessory at a heating rate of 20° C./minute.

The composition of the liquid crystalline polyesters is determined by hydrolyzing about 100 mg of the polyester in a magnetically stirred culture tube in 2 mL of deoxygenated dimethyl sulfoxide (d6) and 0.5 mL of deoxygenated 5 N NaOH in methanol (d4). The hydrolysis is carried out at 80° C. After the hydrolysis, the tube is cooled slightly and then 5 ml of deoxygenated $D_2O$ containing a reference is added to dissolve all the solids. The solution is then added to a NMR tube and capped. The proton NMR spectral data are collected with a JEOL Delta 270 Spectrometer operating at 270.05 MHz for observation of the proton nucleus.

The LCP/carbon black/glass fiber compositions are prepared with Black Pearl 800 carbon black (Cabot Corporation) having an average particle size of 17 nm and Owens Corning fiberglass OC492A having a diameter of 11 microns and a length of 6.4 mm (¼ inch) or Owens Corning fiberglass OC408BC having a diameter of 14 microns and a length of 6.4 mm (¼ inch) by compounding in and extruding from a 30-mm Werner-Pfleiderer extruder having an L/D ratio of 32, 9 barrels, and 6 zones. The LCP and carbon black are fed at the throat of the extruder and the glass fiber is fed downstream through a side feeder. A temperature set point of 335° C. is used in the first half of the extruder to insure complete melting of the LCP. A lower set point of 310° C. is used in the downstream half of the extruder to improve the integrity of the extrudate strand that is chopped into about 3 mm (about ⅛-inch) pellets. The compounded pellets are injection molded into tests bars 13 mm×125 mm×0.8 mm on a Boy 50 Injection Molding Machine with a 335° C. melt temperature and a 90° C. mold temperature. The liquid crystalline polymer and the compounded pellets are dried at 150° C. overnight in a Conair dehumidifying dryer before each step. The flammability of the 0.8 mm-thick test bars is determined as specified by the UL-94 Flammability test.

EXAMPLE 1 AND COMPARATIVE EXAMPLE C-1

A liquid crystalline polyester consisting of 8.6 mole percent terephthalic acid residues, 20 mole percent 2,6-naphthalenedicarboxylic acid residues, 28.6 mole percent hydroquinone residues and 42.8 mole percent p-hydroxybenzoic acid residues and having an I.V. of about 6.0 dL/g is prepared by melt polymerization procedures from terephthalic acid, 2,6-naphthalenedicarboxylic acid, p-diacetoxybenzene, and p-acetoxybenzoic acid. The LCP then is compounded with Owens Corning OC492A fiberglass to prepare a liquid crystalline polyester molding composition containing 30 weight percent fiberglass (Comparative Example C-1). The same LCP is compounded with carbon black and Owens Corning OC492A glass fiber to obtain a liquid crystalline polyester molding composition containing 1.0 weight percent carbon black and 30 weight percent fiberglass (Example 1). Tests bars 13 mm×125 mm×0.8 mm thick are prepared from both molding compositions and the flammability characteristics are determined by the UL-94 Flammability Test. The flammability rating of the (1) Example 1 test bars is V-O/33 and (2) Comparative Example C-1 test bars is V-O/42 as determined by the UL-94 20 mm Vertical Burning Test. The values "33" and "42" refer to total afterflame times (in seconds) for a set of 5 bars tested, i.e., the sum of the afterflame times $(t_1+t_2)$ for a set of 5 bars. The times $t_1+t_2$ are the times in seconds which a bar continues to flame after the flame source has been removed. "Tests for Flammability of Plastics Materials—UL 94", published May 14, 1993, further define times $t_1+t_2$. If the sum of afterflame times $t_1+t_2$ for a set of 5 samples exceeds 50 seconds, the UL 94 rating cannot be V-O.

Example 1 and Comparative Example C-1 illustrate that carbon black reduces significantly the flammability, especially the afterflame times, of a liquid crystalline polyester molding composition according to the present invention.

EXAMPLES 2 AND 3 AND COMPARATIVE EXAMPLE C-2

A liquid crystalline polyester consisting of 8.6 mole percent terephthalic acid residues, 20 mole percent 2,6-naphthalenedicarboxylic acid residues, 28.6 mole percent hydroquinone residues and 42.8 mole percent p-hydroxybenzoic acid residues and having an I.V. of about 6.2 dL/g is prepared from terephthalic acid, 2,6-naphthalenedicarboxylic acid, p-diacetoxybenzene, and p-acetoxybenzoic acid and further polymerized by a solid stating procedure. The LCP is compounded with Owens Corning OC408BC fiberglass to prepare a liquid crystalline polyester molding composition containing 30 weight percent fiberglass (Comparative Example C-2). The same LCP is compounded with carbon black and Owens Corning OC408BC glass fiber to obtain liquid crystalline polyester molding compositions containing 1.0 weight percent carbon black and 30 weight percent fiberglass (Example 2) and 2.0 weight percent carbon black and 30 weight percent fiberglass (Example 3). Tests bars 13 mm ×125 mm×0.8 mm thick (½ inch×5 inch×⅟₃₂ inch thick) are prepared from all three molding compositions and the mechanical properties and flammability characteristics (UL-94 Flammability Test) are determined. Flammability tests were performed on 13 mm ×125 mm×0.8 mm bars. Tensile tests were performed on 19 mm×216 mm×3.2 thick (¾ inch×8.5 inch×⅛ inch thick) bars. Flexural tests were performed on 13 mm×127 mm×19 mm thick (½ inch×5 inch×⅛ inch thick) bars. The results are shown in Table I. The values given for the heat distortion temperatures (HDT; ASTM D 648; at 264 pounds per square inch) are ° C.; the values given for tensile strength (ASTM D 638) are pounds per square inch; the values given for elongation at break (ASTM D 638) are percentages; and the values given for Notched Izod (ASTM D 256; performed at 23° C.) are foot-pounds per inch.

These examples further illustrate that carbon black significantly reduces the afterflame time of the samples and has no deleterious effect on the critical mechanical properties of the LCP when compounded with 30 weight percent fiberglass.

TABLE 1

| | Examples | | |
|---|---|---|---|
| | C-2 | 2 | 3 |
| HDT | 296 | 297 | 296 |
| Tensile Strength | 18,169 | 19,859 | 19,325 |
| Elongation at Break | 1.5 | 1.7 | 1.8 |
| Notched Izod | 2.1 | 1.9 | 1.9 |
| UL-94 Rating | V2/42 | V0/32 | V0/36 |

The Example C-2 molding composition received a V2 rating because one of the five bars tested dripped and ignited the cotton. The afterflame time for this composition was 42 seconds which is lower than the 50-second afterflame time allowed for a V-O rating.

EXAMPLE 4 AND COMPARATIVE EXAMPLE C-3

A liquid crystalline polyester consisting of 8.6 mole percent terephthalic acid residues, 20 mole percent 2,6-naphthalenedicarboxylic acid residues, 28.6 mole percent hydroquinone residues and 42.8 mole percent p-hydroxybenzoic acid residues and having an I.V. of about 6.5 dL/g is prepared from terephthalic acid, 2,6-naphthalenedicarboxylic acid, p-diacetoxybenzene, and p-acetoxybenzoic acid and further polymerized by a solid stating procedure. The LCP is compounded with Owens Corning OC408BC fiberglass to prepare a liquid crystalline polyester molding composition containing 30 weight percent fiberglass (Comparative Example C-3). The same LCP is compounded with carbon black and Owens Corning OC408BC glass fiber to obtain a liquid crystalline polyester molding composition containing 1.0 weight percent carbon black and 30 weight percent fiberglass (Example 4). Tests bars 13 mm×125 mm×0.8 mm thick are prepared from both molding compositions and the flammability characteristics (UL-94 Flammability Test) are determined for two groups of five test bars for each molding composition. The test bars prepared from the Comparative Example C-3 composition have flammability ratings of V-O/45 and V-O/47 whereas the test bars prepared from the Example 4 composition have flammability ratings of V-O/35 and V-O/38.

EXAMPLE 5

A liquid crystalline polyester consisting of 8.6 mole percent terephthalic acid residues, 20 mole percent 2,6-naphthalenedicarboxylic acid residues, 28.6 mole percent hydroquinone residues and 42.8 mole percent p-hydroxybenzoic acid residues and having an I.V. of about 6.1 dL/g is prepared from terephthalic acid, 2,6-naphthalenedicarboxylic acid, p-diacetoxybenzene, and p-acetoxybenzoic acid and further polymerized by a solid stating procedure. This LCP is compounded with carbon black and Owens Corning OC408BC glass fiber to obtain a liquid crystalline polyester molding composition containing 1.0 weight percent carbon black and 30 weight percent fiberglass. Tests bars 13 mm×125 mm×0.8 mm thick are prepared from the molding composition and the flammability characteristics (UL-94 Flammability Test) are determined for two groups of five test bars. Both groups of test bars have flammability ratings of V-O/40.

EXAMPLE 6

A liquid crystalline polyester consisting of 8.6 mole percent terephthalic acid residues, 20 mole percent 2,6- naphthalenedicarboxylic acid residues, 28.6 mole percent hydroquinone residues and 42.8 mole percent p-hydroxybenzoic acid residues and having an I.V. of about 6.0 dL/g is prepared from terephthalic acid, 2,6-naphthalenedicarboxylic acid, p-diacetoxybenzene, and p-acetoxybenzoic acid and further polymerized by a solid stating procedure. This LCP is compounded with carbon black and Owens Corning OC408BC glass fiber to obtain a liquid crystalline polyester molding composition containing 1.0 weight percent carbon black and 30 weight percent fiberglass. Tests bars 13 mm×125 mm×0.8 mm thick are prepared from the molding composition and the flammability characteristics (UL-94 Flammability Test) are determined for two groups of five test bars. Both groups of test bars have flammability ratings of V-O/37.

EXAMPLE 7 AND COMPARATIVE EXAMPLE C-4

A liquid crystalline polyester consisting of 12.7 mole percent terephthalic acid residues, 20.7 mole percent 2,6-naphthalenedicarboxylic acid residues, 33.4 mole percent hydroquinone residues and 33.2 mole percent p-hydroxybenzoic acid residues and having an I.V. of about 6.8 dL/g and a melting point of 332° C. is prepared by melt polymerization from terephthalic acid, 2,6-naphthalenedicarboxylic acid, p-diacetoxybenzene, and p-acetoxybenzoic acid. This LCP is compounded in a Werner-Pfleiderer extruder, in one case, with Owens Corning OC-492A glass fiber to obtain a liquid crystalline polyester molding composition containing 30 weight percent fiberglass (Comparative Example 4 composition) and, in a second case, with Black Pearl 800 carbon black (Cabot Corporation) and Owens Corning OC-492A glass fiber to obtain a liquid crystalline polyester molding composition containing 1.0 weight percent carbon black and 30 weight percent fiberglass (Example 7 composition). Tests bars 13 mm×125 mm×0.8 mm thick are prepared from the molding compositions by injection molding in a Boy 50-S Injection Molding Machine and the flammability characteristics (UL-94 Flammability Test) are determined for two groups of five test bars. The test bars prepared from the Example 7 composition had a total burn time of 27 seconds and a flammability rating of V-O whereas the test bars prepared from the Comparative Example 4 composition had a total burn time of 101 seconds and a flammability rating of V-1.

EXAMPLE 8 AND COMPARATIVE EXAMPLE C-5

A liquid crystalline polyester consisting of 3.9 mole percent terephthalic acid residues, 15.4 mole percent 2,6-naphthalenedicarboxylic acid residues, 19.3 mole percent hydroquinone residues and 61.4 mole percent p-hydroxybenzoic acid residues and having an I.V. of 6.6 dL/g and a melting point of 322° C. is prepared by melt polymerization from terephthalic acid, 2,6-naphthalenedicarboxylic acid, p-diacetoxybenzene, and p-acetoxybenzoic acid. This LCP is compounded in a Werner-Pfleiderer extruder, in one case, with Owens Corning OC-492A glass fiber to obtain a liquid crystalline polyester molding composition containing 30 weight percent fiberglass (Comparative Example 5 composition) and, in a second case, with Black Pearl 800 carbon black (Cabot Corporation) and Owens Corning OC-492A glass fiber to obtain a liquid crystalline polyester molding composition containing 1.0 weight percent carbon black and 30 weight percent fiberglass (Example 8 composition). Tests bars 13 mm×125 mm×0.8 mm thick are prepared from the molding compositions by injection molding in a Boy 50-S Injection Molding Machine and the flammability characteristics (UL-94 Flammability Test) are determined for two groups of five test bars. The test bars prepared from the Example 8 composition had a total burn time of 39 seconds and a flammability rating of V-O whereas the test bars prepared from the Comparative Example 5 composition had a total burn time of 83 seconds and a flammability rating of V-1.

EXAMPLE 9 AND COMPARATIVE EXAMPLE C-6

A liquid crystalline polyester consisting of 10.3 mole percent terephthalic acid residues, 25.2 mole percent 2,6-naphthalenedicarboxylic acid residues, 35.5 mole percent hydroquinone residues and 29.0 mole percent p-hydroxybenzoic acid residues and having an I.V. of 5.8 dL/g and a melting point of 325° C. is prepared by melt polymerization from terephthalic acid, 2,6-naphthalenedicarboxylic acid, p-diacetoxybenzene, and p-acetoxy benzoic acid. This LCP is compounded in a Werner-Pfleiderer extruder, in one case, with Owens Corning OC-492A glass fiber to obtain a liquid crystalline polyester molding composition containing 30 weight percent fiberglass (Comparative Example 6 composition) and, in a second case, with Black Pearl 800 carbon black (Cabot Corporation) and Owens Corning OC-492A glass fiber to obtain a liquid crystalline polyester molding composition containing 1.0 weight percent carbon black and 30 weight percent fiberglass (Example 9 composition). Tests bars 13 mm×125 mm×0.8 mm thick are prepared from the molding compositions by injection molding in a Boy 50-S Injection Molding Machine and the flammability characteristics (UL-94 Flammability Test) are determined for two groups of five test bars. The test bars prepared from the Example 9 composition had a total burn time of 42 seconds and a flammability rating of V-O whereas the test bars prepared from the Comparative Example 6 composition had a total burn time of 90 seconds and a flammability rating of V-1.

EXAMPLE 10 AND COMPARATIVE EXAMPLE C-7

The procedures described in Examples 7–9 are repeated to prepare compositions comprising a liquid crystalline polyester consisting of 14.3 mole percent terephthalic acid residues, 14.3 mole percent 2,6-naphthalenedicarboxylic acid residues, 28.6 mole percent hydroquinone residues and 42.8 mole percent p-hydroxybenzoic acid residues containing (1) 30 weight percent PPG 3540 fiberglass (Comparative Example 7 composition) and (2) 1.0 weight percent carbon black and weight percent PPG 3540 fiberglass (Example 10 composition). The flammability characteristics (UL-94 Flammability Test) are determined for two groups of five test bars 13 mm×125 mm×0.8 mm thick prepared from the compositions. The test bars prepared from the Example 10 composition had a total burn time of 27 seconds and a flammability rating of V-O whereas the test bars prepared from the Comparative Example 7 composition had a total burn time of 101 seconds and a flammability rating of V-1.

EXAMPLE 11 AND COMPARATIVE EXAMPLE C-8

The procedures described in Examples 7–9 are repeated to prepare compositions comprising a liquid crystalline polyester consisting of 8.6 mole percent terephthalic acid residues, 20.0 mole percent 2,6-naphthalenedicarboxylic acid residues, 28.6 mole percent hydroquinone residues and 42.8 mole percent p-hydroxybenzoic acid residues containing (1) 30 weight percent PPG 3540 fiberglass (Comparative Example 8 composition) and (2) 1.0 weight percent carbon black and 30 weight percent PPG 3540 fiberglass (Example 11 composition). The flammability characteristics (UL-94 Flammability Test) are determined for two groups of five test bars 13 mm×125 mm×0.8 mm thick prepared from the compositions. The test bars prepared from the Example 11 composition had a total burn time of 43 seconds and a flammability rating of V-O whereas the test bars prepared from the Comparative Example 8 composition had a total burn time of 87 seconds and a flammability rating of V-1.

EXAMPLE 12 AND COMPARATIVE EXAMPLE C-9

The procedures described in Examples 7–9 are repeated to prepare compositions comprising a liquid crystalline polyester consisting of 3.8 mole percent terephthalic acid residues, 19.2 mole percent 2,6-naphthalenedicarboxylic acid residues, 23.0 mole percent hydroquinone residues and 54.0 mole percent p-hydroxybenzoic acid residues containing (1) 30 weight percent PPG 3540 fiberglass (Comparative Example 9 composition) and (2) 1.0 weight percent carbon black and 30 weight percent PPG 3540 fiberglass (Example 12 composition). The flammability characteristics (UL-94 Flammability Test) are determined for two groups of five test bars 13 mm×125 mm×0.8 mm thick prepared from the compositions. The test bars prepared from the Example 12 composition had a total burn time of 39 seconds and a flammability rating of V-O whereas the test bars prepared from the Comparative Example 9 composition had a total burn time of 83 seconds and a flammability rating of V-1.

The invention has been described in detail with particular reference to preferred embodiments thereof, but it will be understood that variations and modifications will be effected within the spirit and scope of the invention.

We claim:

1. A liquid crystalline polyester molding composition comprising:
   (i) a liquid crystal polyester consisting essentially of about 1.5 to 25 mole percent terephthalic acid (T) residues, about 6.5 to 37 mole percent 2,6-naphthalenedicarboxylic acid (N) resides, about 16 to 42 mole percent hydroquinone (HQ) residues, and about 17 to 67 mole percent p-hydroxybenzoic acid (PHB) residues; wherein the total mole percent of T, N, HQ and PHB residues is equal to 100; and
   (ii) about 0.1 to 5 weight percent, based on the total weight of the liquid crystalline polyester molding composition, carbon black;
   provided that articles having a thickness of less than 1.5 mm molded from the molding composition which also contains at least 20 weight percent glass fiber exhibit a flammability classification of 94V -O as determined by the UL-94 20 mm Vertical Burning Test (ASTM D 3801).

2. The molding composition of claim 1 wherein the T:N molar ratio is about 10:90 to about 60:40, the moles of HQ are equal to the total moles of T and N, the liquid crystalline polyesters have melting points determined by differential scanning calorimetry (DSC) equal to or less than 375° C. and the amount of carbon black present is about 0.5 to 5 weight percent, based on the total weight of the liquid crystalline polyester molding composition.

3. A liquid crystalline polyester molding composition comprising:

(i) a liquid crystal polyester consisting essentially of about 1.5 to 25 mole percent terephthalic acid (T) residues, about 6.5 to 37 mole percent 2,6-naphthalenedicarboxylic acid (N) residues, about 16 to 42 mole percent hydroquinone (HQ) residues, and about 17 to 67 mole percent p-hydroxybenzoic acid (PHB) residues; wherein the total mole percent of T, N, HQ and PHB residues is equal to 100;

(ii) about 0.5 to 5 weight percent, based on the total weight of the liquid crystalline polyester molding composition, carbon black; and (iii) at least 20 weight percent, based on the total weight of the liquid crystalline polyester molding composition, glass fiber, provided that articles having a thickness of less than 1.5 mm molded from the molding composition exhibit a flammability classification of 94V -Oas determined by the UL-94 20 mm Vertical Burning Test (ASTM D 3801).

4. The molding composition of claim 3 wherein the T:N molar ratio is about 10:90 to about 60:40, the moles of HQ are equal to the total moles of T and N, the liquid crystalline polyesters have melting points determined by differential scanning calorimetry (DSC) equal to or less than 375° C., and the amount of glass fiber present is about 25 to 40 weight percent, based on the total weight of the liquid crystalline polyester molding composition.

5. The molding composition of claim 3 wherein the T:N molar ratio is about 10:90 to about 60:40, the moles of HQ are equal to the total moles of T and N, the liquid crystalline polyesters have melting points determined by differential scanning calorimetry (DSC) equal to or less than 375° C., the amount of carbon black present is about 1 to 3 weight percent, based on the total weight of the liquid crystalline polyester molding composition, the amount of glass fiber present is about 25 to 40 weight percent, based on the total weight of the liquid crystalline polyester molding composition, and the glass fibers have thicknesses (diameters) of about 9 to 15 microns and fiber lengths of about 0.8 to 26 mm.

6. A molded article having a thickness of less than 1.5 mm and a flammability classification of 94V -O as determined by the UL-94 20 mm Vertical Burning Test (ASTM D 3801) comprised of:

(i) a liquid crystal polyester consisting essentially of about 1.5 to 25 mole percent terephthalic acid (T) residues, about 6.5 to 37 mole percent 2,6-naphthalenedicarboxylic acid (N) residues, about 16 to 42 mole percent hydroquinone (HQ) residues, and about 17 to 67 mole percent p-hydroxybenzoic acid (PHB) residues; wherein the total mole percent of T, N, HQ and PHB residues is equal to 100; and (ii) about 0.1 to 5 weight percent, based on the total weight of the molded article, carbon black.

7. The molded article of claim 6 wherein the T:N molar ratio is about 10:90 to about 60:40, the moles of HQ are equal to the total moles of T and N, the liquid crystalline polyesters have melting points determined by differential scanning calorimetry (DSC) equal to or less than 375° C. and the amount of carbon black present is about 0.5 to 5 weight percent, based on the total weight of the liquid crystalline polyester molding composition.

8. A molded article having a thickness of less than 0.8 mm and a flammability classification of 94V -O as determined by the UL-94 20 mm Vertical Burning Test (ASTM D 3801) comprised of:

(i) a liquid crystal polyester consisting essentially of about 1.5 to 25 mole percent terephthalic acid (T) residues, about 6.5 to 37 mole percent 2,6-naphthalenedicarboxylic acid (N) residues, about 16 to 42 mole percent hydroquinone (HQ) residues, and about 17 to 67 mole percent p-hydroxybenzoic acid (PHB) residues; wherein the total mole percent of T, N, HQ and PHB residues is equal to 100;

(ii) about 0.1 to 5 weight percent, based on the total weight of the molded article, carbon black; and (iii) at least 20 weight percent, based on the total weight of the molded article, glass fiber.

9. The molded article of claim 8 wherein the T:N molar ratio is about 10:90 to about 60:40, the moles of HQ are equal to the total moles of T and N, the liquid crystalline polyesters have melting points determined by differential scanning calorimetry (DSC) equal to or less than 375° C., the amount of carbon black present is about 0.5 to 5 weight percent, based on the total weight of the molded article, and the amount of glass fiber present is about 25 to 40 weight percent, based on the total weight of the molded article.

10. The molded article of claim 8 wherein the T:N molar ratio is about 20:80 to about 45:55, the moles of HQ are equal to the total moles of T and N, the liquid crystalline polyesters have melting points determined by differential scanning calorimetry (DSC) equal to or less than 355° C., the amount of carbon black present is about 1 to 3 weight percent, based on the total weight of the molded article, the amount of glass fiber present is about 25 to 40 weight percent, based on the total weight of the molded article, and the glass fibers have thicknesses (diameters) of about 9 to 15 microns and fiber lengths of about 0.8 to 26 mm.

11. The molding composition of claim 1 wherein the amount of carbon black present is about 1 to 5 weight percent.

12. The molding composition of claim 1 wherein the amount of carbon black present is about 3 to 5 weight percent.

13. The molding composition of claim 3 wherein the amount of carbon black present is about 1 to 5 weight percent.

14. The molding composition of claim 3 wherein the amount of carbon black present is about 3 to 5 weight percent.

15. The molded article of claim 6 wherein the amount of carbon black present is about 1 to 5 weight percent.

16. The molded article of claim 6 wherein the amount of carbon black present is about 3 to 5 weight percent.

17. The molded article of claim 8 wherein the amount of carbon black present is about 1 to 5 weight percent.

18. The molded article of claim 8 wherein the amount of carbon black present is about 3 to 5 weight percent.

* * * * *